US009432064B2

(12) United States Patent
Butler et al.

(10) Patent No.: US 9,432,064 B2
(45) Date of Patent: Aug. 30, 2016

(54) SYSTEM AND METHOD FOR AUTOMATED LOSS TESTING (71) Applicant: Introbotics Corporation, Albuquerque, NM (US)

(72) Inventors: Brian D. Butler, Albuquerque, NM (US); David L. Works, Albuquerque, NM (US)

(73) Assignee: INTROBOTICS CORPORATION, Albuquerque, NM (US)

( * ) Notice: Subject to any disclaimer, the term of this patent is extended or adjusted under 35 U.S.C. 154(b) by 37 days.

(21) Appl. No.: 14/293,085

(22) Filed: Jun. 2, 2014

(65) Prior Publication Data

US 2015/0349899 A1 Dec. 3, 2015

Related U.S. Application Data (60) Provisional application No. 61/938,298, filed on Feb. 11, 2014.

(51) Int. Cl.
*H04B 3/46* (2015.01)
*H04B 1/04* (2006.01)
*G01R 27/26* (2006.01)
*G01R 27/28* (2006.01)
*H04B 17/00* (2015.01)
*H04B 17/17* (2015.01)
*G01R 1/067* (2006.01)
(Continued)

(52) U.S. Cl.
CPC ............ *H04B 1/0475* (2013.01); *G01R 27/26* (2013.01); *G01R 27/28* (2013.01); *G01R 1/06772* (2013.01); *G01R 31/11* (2013.01); *G01R 35/005* (2013.01); *H04B 17/0085* (2013.01); *H04B 17/17* (2015.01)

(58) Field of Classification Search
CPC .... H01S 5/026; H01S 5/0262; H01S 5/0014; G02F 2203/69
USPC ............ 375/227; 385/14; 398/25, 33; 427/8; 438/14, 16
See application file for complete search history.

(56) References Cited

U.S. PATENT DOCUMENTS 3,903,477 A * 9/1975 Cronson et al. ............... 324/642
4,641,085 A 2/1987 Donecker et al.
5,128,619 A 7/1992 Bjork et al.
(Continued)

OTHER PUBLICATIONS

Loyer et al., "SET2DIL: Method to Derive Differential Insertion Loss from Single-Ended TDR/TDT Measurements.", Designcon 2010 (2010), entire document especially p. 5-6 [online] URL=<http://www.magazines007.com/pdf/DC10_Loyer_Kunze.pdf>.

*Primary Examiner* — Leila Malek
(74) *Attorney, Agent, or Firm* — Dennis F. Armijo (57) ABSTRACT A method and device for analyzing time domain waveforms traveling in electronic interconnect for the purpose of measuring the attenuation. This includes the use of an automated processing system and method to transmit a TDR step pulse into one end of an interconnect and to record the time domain waveform response from the same end of the interconnect. The processing algorithms separate the portions of the collected time domain waveform which contain return loss and insertion loss information and process each portion of that waveform data through FFT techniques to extract the frequency dependent loss data. The method describes the calibration techniques required to achieve these measurements and the device utilized can be a manual or robotic probing system.

24 Claims, 8 Drawing Sheets (51) Int. Cl.
 *G01R 35/00* (2006.01)
 *G01R 31/11* (2006.01)

(56) References Cited

U.S. PATENT DOCUMENTS

| | | |
|---|---|---|
| 5,633,801 A | 5/1997 | Bottman |
| 6,687,289 B1 | 2/2004 | Bohley |
| 6,693,435 B2 | 2/2004 | Iskanius |
| 6,781,386 B2 | 8/2004 | Henaff |
| 6,980,007 B1 | 12/2005 | Lo et al. |
| 7,400,151 B2 | 7/2008 | Beene |
| 7,940,056 B2 | 5/2011 | Maslen |
| 8,069,491 B2 | 11/2011 | Lesher |
| 2002/0163340 A1 | 11/2002 | Sciacero et al. |
| 2006/0097730 A1 | 5/2006 | Park et al. |
| 2007/0265793 A1 | 11/2007 | Booth et al. |
| 2010/0312506 A1* | 12/2010 | Taylor .................. 702/59 |
| 2011/0191046 A1 | 8/2011 | Pupalaikis |
| 2013/0265079 A1 | 10/2013 | Pupalaikis |

* cited by examiner

SYSTEM AND METHOD FOR AUTOMATED LOSS TESTING

RELATED APPLICATIONS

The present application claims priority to U.S. Provisional Application No. 61/938,298, filed Feb. 11, 2014, assigned to Assignee hereof, the specification of which is incorporated herein by reference.

BACKGROUND OF THE INVENTION

1. Field of the Invention (Technical Field)

The presently claimed invention relates to automated testing and more particularly to methods and apparatuses for the production testing of passive electronic interconnects to evaluate the frequency dependent loss characteristics.

2. Background Art

Interconnects including cables, cable assemblies, connectors, and printed wiring board traces that support fast data transfer rates can experience higher and varied attenuation profiles depending on the non-repeatability in their manufacturing processes. There is a shortage of test methodologies and equipment to measure signal loss in a production environment for passive interconnects such as cables, connectors, and printed wiring board traces. The bulk of the current art for measuring loss, including vector network analyzers, utilizes swept frequency test signals through the device under test to determine changes in amplitude and phase. These methods are typically utilized in a laboratory environment and require a specific skill set to calibrate, operate and to interpret the measurement results. The cost of the equipment is usually high and many times prohibitive due to the cost and complexity.

Other current prior art systems involve the use of Time Domain Transmission (TDT) instrumentation to capture data that is then coupled with mathematical techniques, such as Fourier transforms, to convert the collected data into a format that can be displayed in the frequency domain similar to the data from vector network analyzers. This method does reduce the operational sophistication of the measurement process and can reduce the cost of the process. However, these techniques have been limited to processes involving the use of test structures that are different from the actual product to be tested. Short Pulse Propagation and Single Ended Transmission to Differential Insertion Loss (SET2DIL) are two techniques that utilize test coupons in this fashion to assess the loss for printed wiring board traces. A test coupon is defined as a device that is utilized for testing and that is manufactured alongside a PC board that can later be broken away for specific tests. A limitation in these methods is that the test structures within these test coupons are designed to represent the actual interconnect, but often can have different network characteristics than the actual printed wiring board traces.

Other related systems involve the testing of cables utilizing time domain methods and equipment. These methods include injecting signals from one end of the cable and measuring responses from the other end of the cable, injecting signals from one end of the cable and measuring the response from the same end of the cable with termination impedance at the far end, which substantially matches the impedance of the cable, and injecting signals from one end of the cable and measuring the response from the same end of the cable with an open termination at the opposite end. These systems have limitations in the calibration methodology and the processing of the response waveforms to achieve the measurements. The focus of these related systems is to resolve discontinuities that may exist in cable assemblies due to splices, branching of the cable or other defects and not on passive interconnects.

SUMMARY OF THE INVENTION

Disclosure of the Invention

The presently claimed invention overcomes the shortcomings of the prior art system by providing a novel method, system and computer program for accurate and simplified loss testing using a single probe. The method applies a windowing technique to waveforms acquired from a step reflected from a probe in contact with a DUT (DUT measurement) and a step reflected from a probe only (Calibration measurement). The insertion loss and return loss are then calculated from the windowed results.

A primary object of the present invention is to provide a simple to use production test system and method to test printed wiring boards, connectors, and cable assemblies.

Other objects, advantages and novel features, and further scope of applicability of the presently claimed invention will be set forth in part in the detailed description to follow, taken in conjunction with the accompanying drawings, and in part will become apparent to those skilled in the art upon examination of the following, or may be learned by practice of the claimed invention. The objects and advantages of the claimed invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

Best Modes for Carrying Out the Invention

Figure 1:
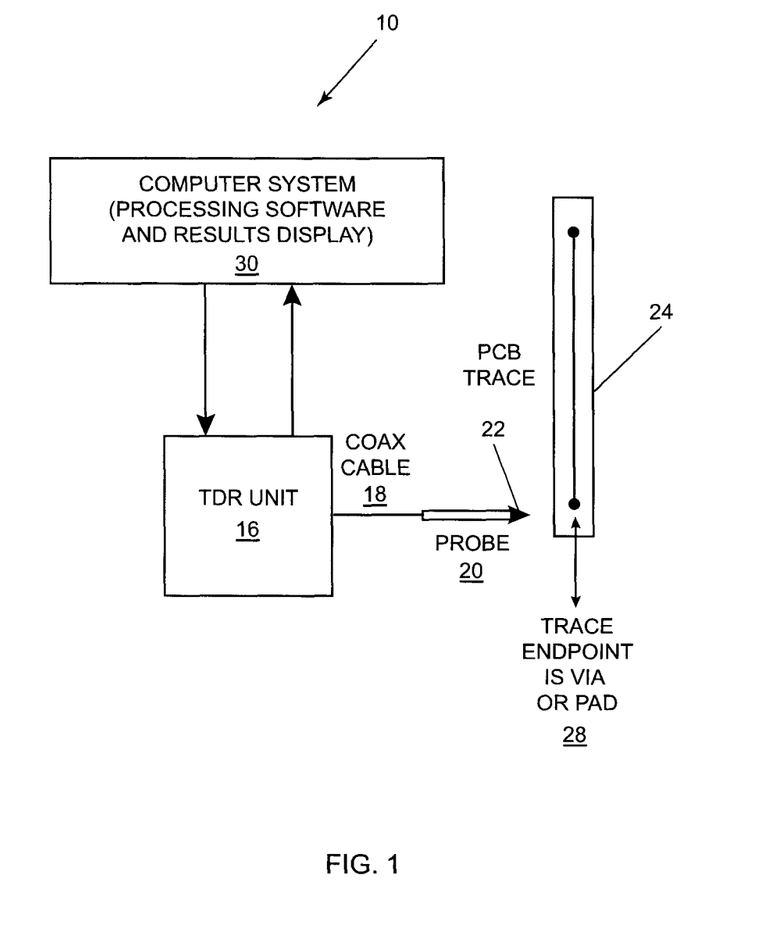
FIG. 1 shows an embodiment of an operator hand probing system.
Figure 2:
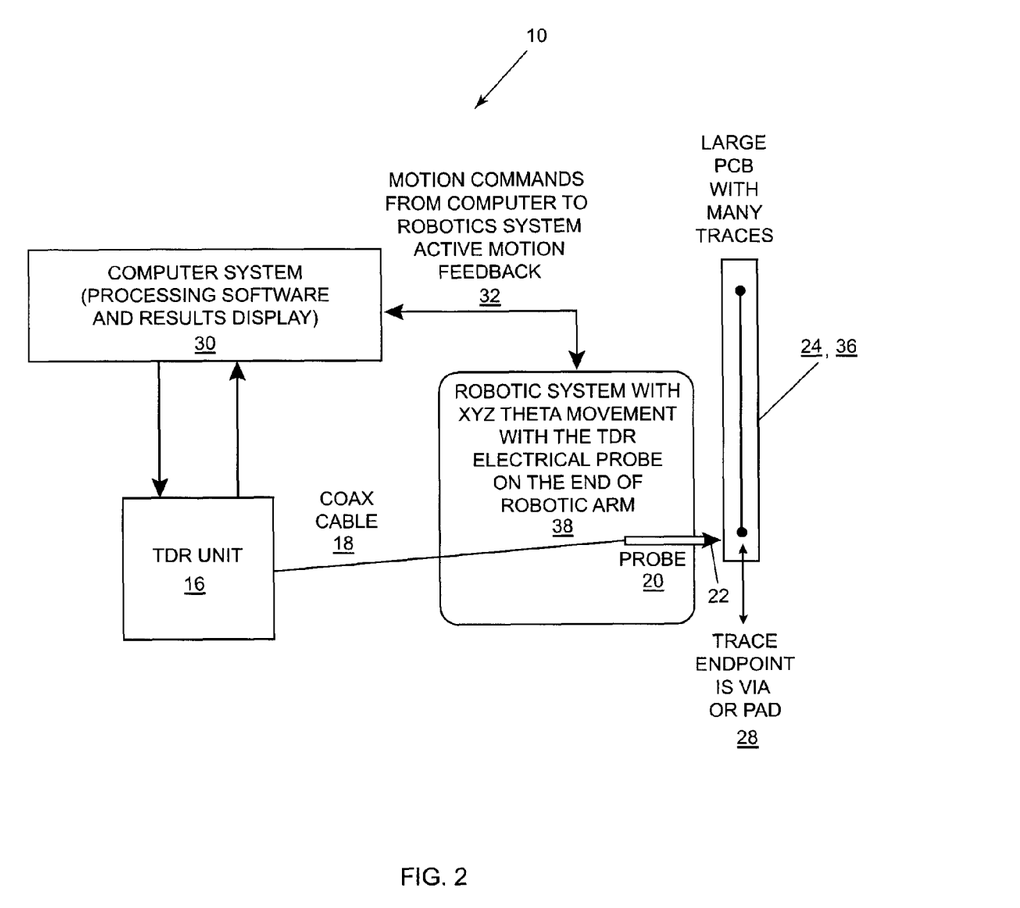
FIG. 2 shows an embodiment of a robotic probing system.

FIGS. 1 and 2 show examples of the components for a preferred embodiment. System 10 has voltage step generator and sampler connected to a single channel, hereinafter referred to as Time-Domain Reflectometer (TDR) 16. Cable 18 connecting TDR 16 to a rf probe 20, cable 18 and rf probe 20 capable of high fidelity transmission of the voltage step between TDR 16 and probe tip 22. System 10 requires Device Under Test, or DUT 24, and a means to make high fidelity contact between DUT 24 and probe tip 22. Examples of DUT 24 can include Printed Circuit Board (PCB) interconnect, PCB coupon trace 28, or cable.

Contact between DUT 24 and probe tip 22 may be made by hand as shown in FIG. 1 or by any level of mechanization as shown in FIG. 2, including robotic, as described in Applicants U.S. Pat. Nos. 6,759,853 and 6,798,229, the teachings pf which are incorporated as if fully set forth herein. System 10 preferably has a computer 30 interfaced with TDR 16 to transfer data and execute processing algorithms, as described below. Although, this description only discusses a single TDR, rf probe, and DUT, this disclosure includes any number and combinations of TDR's, rf probes, and DUT's.

An example of a mechanized system of FIG. 2 includes a robotic system 38 capable of connecting multiple cable 18 and RF probe assemblies 20 to multiple TDR's 16. Robotic system 38 includes PCB board holder and one or more arms used to make contact between the probe tips 22 and DUT's 24. PCB board 36 may contain thousands of DUT's 24, including single-ended, differential interconnects, and the like. Robotic system 38 is preferably programmed to contact single-ended interconnects 28 with one TDR channel and differential interconnects with two TDR channels and using predetermined probes 20. Robotic system 38 includes computer 30 that provides motion commands 32 and collects and saves TDR waveform data for processing. Processing algorithms may execute in real-time or after all data is collected and saved. Robotic system 38 operates in a testing mode in which a TDR waveform ("DUT waveform") is collected while probe 20 is in contact with DUT 24, and in a calibration mode in which a TDR waveform ("CAL waveform") is collected of a probe only 20—no probe contact with DUT 24. The DUT and CAL waveform collection windows are set to save the entire reflected step along with a suitable distance of stable waveform before and after the reflected step.

Figure 3:
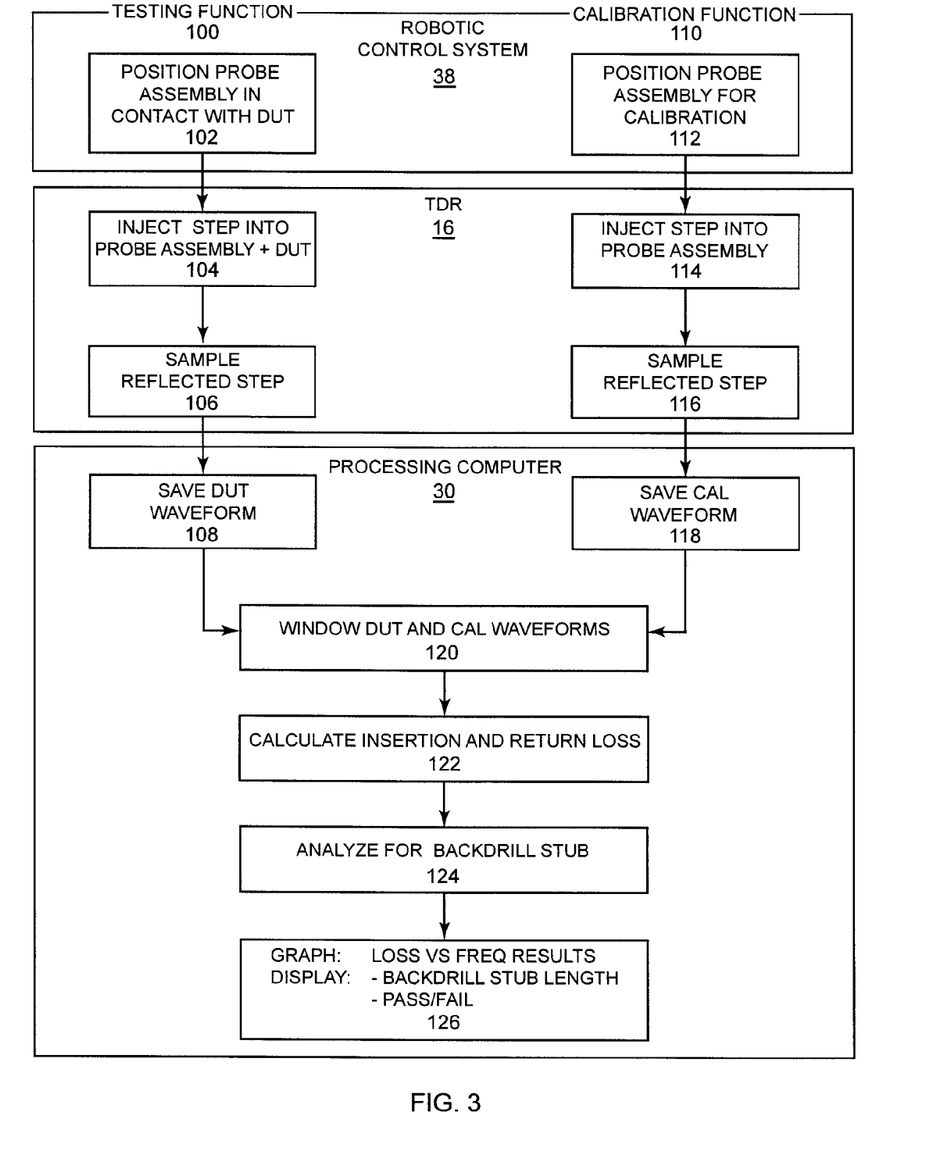
FIG. 3 is a flow chart showing the method of claimed invention.

By using the preferred components described above, the process or method of obtaining insertion and return loss information from the DUT and CAL waveforms is described in FIG. 3. For testing function 100, the probe is positioned in contact with DUT 102. In this example robotic control system 38 is utilized. Step is then injected into probe assembly and DUT 104, via TDR 16. The reflected step is sampled 106 and the DUT waveforms are saved 108 in the computer 30.

Figures 4A, 4B:
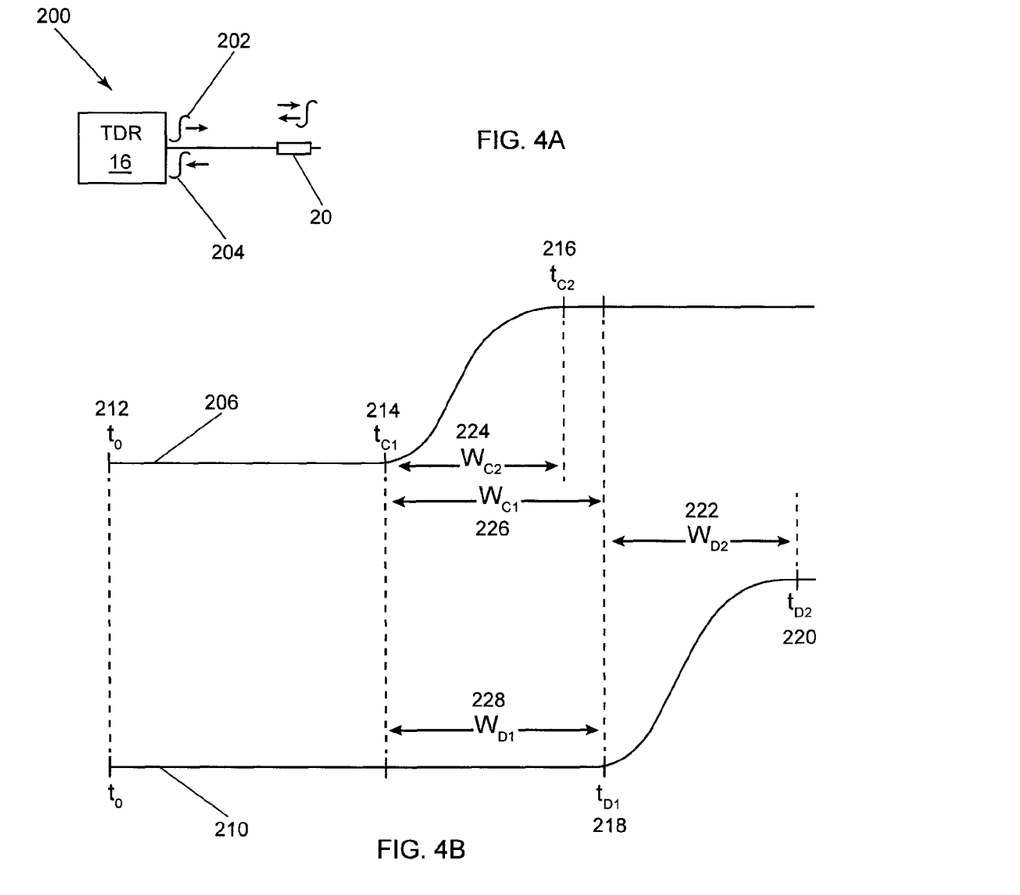
FIG. 4A shows the calibration embodiment with probe terminated in an open.
FIG. 4B is a graphic image of the windowing embodiment.
Figure 5A:
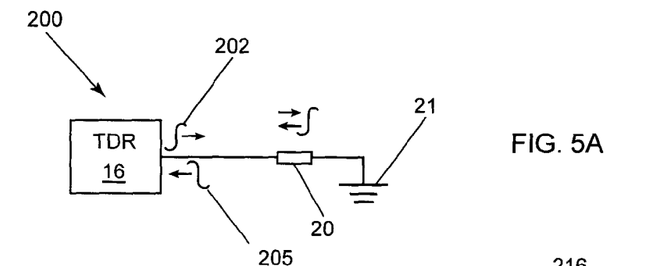
FIG. 5A shows the calibration embodiment with a probe terminated in a short.

In the calibration function 110, the probe is positioned for calibration 112, not in contact with the DUT as shown in FIG. 4A or grounded as shown in FIG. 5A. Thus, the probe is terminated in either an open or a short. The step is injected into the probe assembly 114 in TDR 16. The reflected step is sampled 116 and the calibrated (CAL) waveform is saved 118 by computer 30.

Next in the process is to window the saved DUT and CAL waveforms 120 and calculate the insertion and return loss 122 using the algorithms described below. Next, the process analyzes for backdrill stubs 124 and graphs a display 126 of the loss versus the frequency results, determines the backdrill stub length and finally provides a pass or fail determination.

Figure 4C:
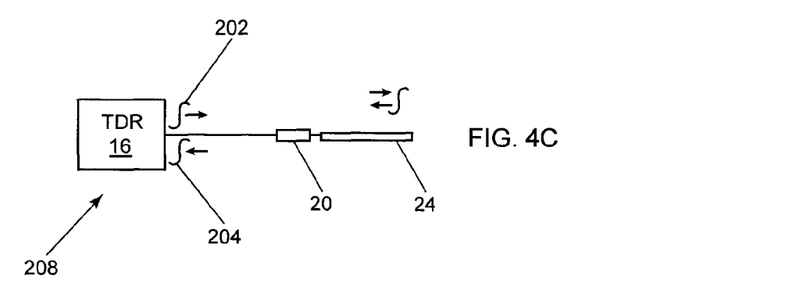
FIG. 4C shows the testing embodiment.
Figure 5B:
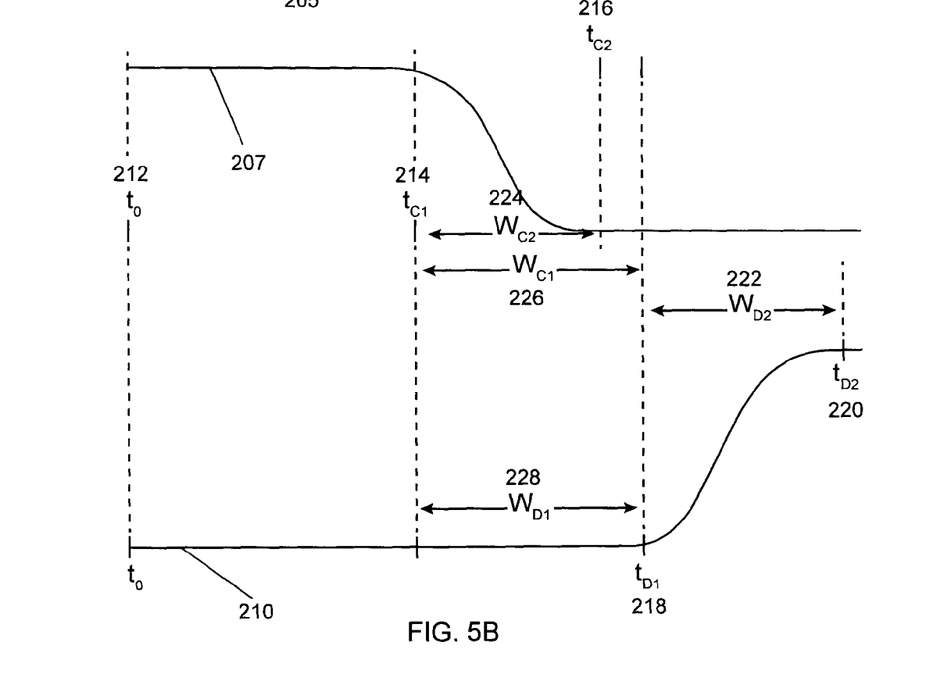
FIG. 5B is a graphic image of the windowing embodiment.
Figure 5C:
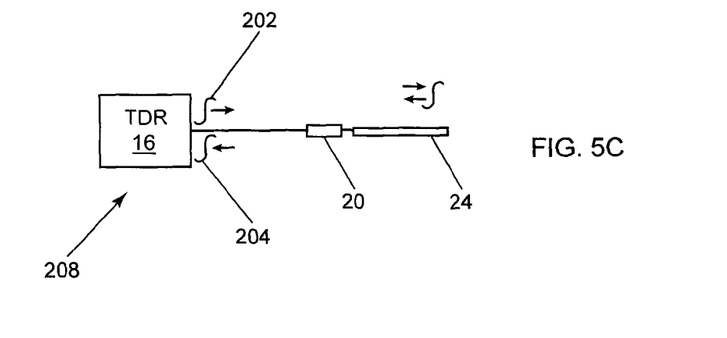
FIG. 5C shows the testing embodiment.

FIGS. 4A, 4B, and 4C show the windowing embodiment using the saved DUT and CAL waveforms of FIG. 3 in which the CAL waveform is saved with the probe terminated in an open. FIGS. 5A, 5B, and 5C show the windowing embodiment using the saved DUT and CAL waveforms of FIG. 3 in which the CAL waveform is saved with the probe terminated in a short. The windowing embodiment, as described in the following paragraphs, applies equally to CAL waveforms saved with the probe terminated in an open or short. The following description references FIGS. 4A-4C; however, FIGS. 5A-5C could equally be used. In FIG. 4A, a calibration system 200 is shown, including TDR 16, RF probe 20 not in contact with anything and injected step 202 and return step 204. This results in CAL waveform 206 of FIG. 4B. Similarly, FIG. 4C also shows DUT measuring system 208, which includes TDR 16, RF probe 20 in contact with DUT 24 and injected step 202 and return step 204, which results in DUT waveform 210 of FIG. 4B. These waveforms are time based with starting time t0 212.

In FIG. 5A, a similar calibration system 200 is shown however this time with the calibration in a short mode, including TDR 16, RF probe 20 in contact with ground 21 and injected step 202 and return step 205. This results in CAL waveform 207 of FIG. 5B. Similarly, FIG. 5C also shows DUT measuring system 208, which includes TDR 16, RF probe 20 in contact with DUT 24 and injected step 202 and return step 204, which results in DUT waveform 210 of FIG. 5B. These waveforms are time based with starting time t0 212. The remaining steps for windowing and calculating are similar for the open calibration or shorted calibration, as set forth below.

As shown in FIG. 4B or 5B, using CAL waveform 206, select a position, $t_{C1}$ 214, to the left of the reflected step that represents a point in time at which energy reflected from the probe tip first begins to reach the sampler. Next, select a position, $t_{C2}$ 216, to the right of the reflected step that represents a point in time at which all energy from frequencies above a desired threshold reflected from the probe tip has reached the sampler.

Using DUT waveform 210, select a position, $t_{D1}$ 218, to the left of the reflected step that represents a point in time at which energy reflected from the open end of the DUT first begins to reach the sampler. Next, select a position, $t_{D2}$ 220, to the right of the reflected step that represents a point in time at which all energy from frequencies above a desired threshold reflected from the open end of the DUT has reached the sampler.

Using DUT waveform 210, select data between positions $t_{D2}$ 220 and $t_{D1}$ 218. This windowed subset of DUT waveform 210 is referred to as $W_{D2}$ 222 that represents a window length and calculated as $W_{D2}=t_{D2}-t_{D1}$. Using CAL waveform 206 or 207, select data between a starting position of $t_{C1}$ 214 and an ending position of $t_{C1}+(t_{D2}-t_{D1})$. This windowed subset of CAL waveform 206 or 207 is referred to as $W_{C2}$ 224 (window length=$t_{D2}-t_{D1}$).

Using both the DUT 210 and CAL waveforms 206 or 207, select data between positions $t_{D1}$ 218 and $t_{C1}$ 214. This windowed subset of DUT waveform 210 is referred to as $W_{D1}$ 228. This windowed subset of CAL waveform 206 or 207 is referred to as $W_{C1}$ (window length=$t_{D1}-t_{C1}$). Note that in the DUT waveform 210 of FIG. 4B or 5B, insertion loss is calculated using the windowed waveform to the right of $t_{D1}$ and return loss is calculated using the windowed waveform to the left of $t_{D1}$. Also note that $W_{D1}$ 228 may be narrowed in order to calculate the return loss of a segment of the DUT, for example to calculate the return loss of the via.

To calculate insertion and return loss in decibels, the following formulas are utilized:

$$\text{insertion loss (dB)} = 0.5 * 20 \, \text{Log} \, 10(\text{FFT}(dW_{D2}/dt)/\text{FFT}(dW_{C2}/dt))$$

$$\text{return loss (dB)} = 20 \, \text{Log} \, 10(\text{FFT}(dW_{D1}/dt)/\text{FFT}(dW_{C1}/dt))$$

where d/dt represents the first time derivative and FFT represents fast Fourier transform. The factor of 0.5 in the insertion loss formula is needed because the energy collected in the TDR waveform is round-trip.

Note that for very short DUT's, those in which $t_{D1}$ 218 is less than $t_{C2}$ 216, the windowed subset of CAL waveform 206 or 207 may be inadequate to capture the full incident energy and therefore the above calculation of return loss will not be accurate. The DUT must be long enough so that the incident step makes a full transition over its length. For example, steps with frequency content of up to 20 GHz make a full transition over approximately 60 ps, which corresponds to a DUT length of about 0.5 inch.

Figure 6A:
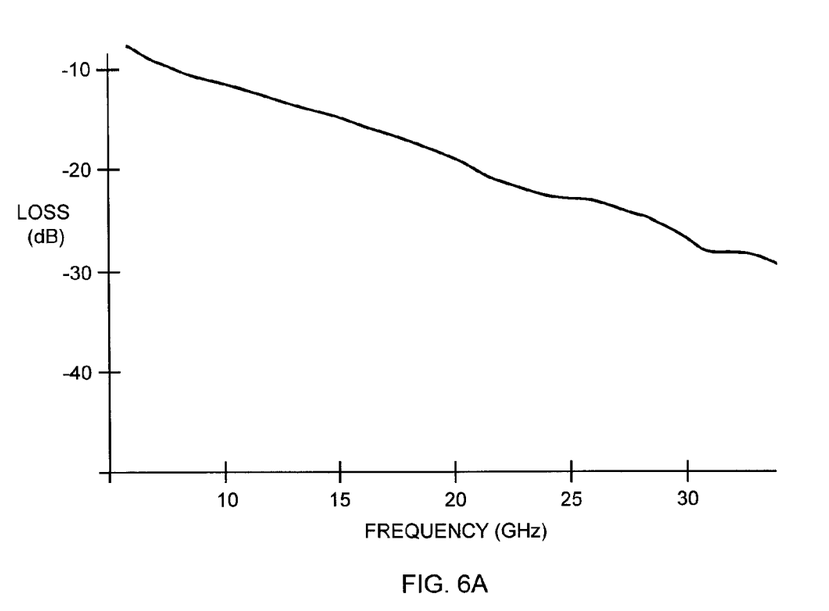
FIG. 6A is a graph showing the measured attenuation interconnect with a proper backdrill.
Figure 6B:
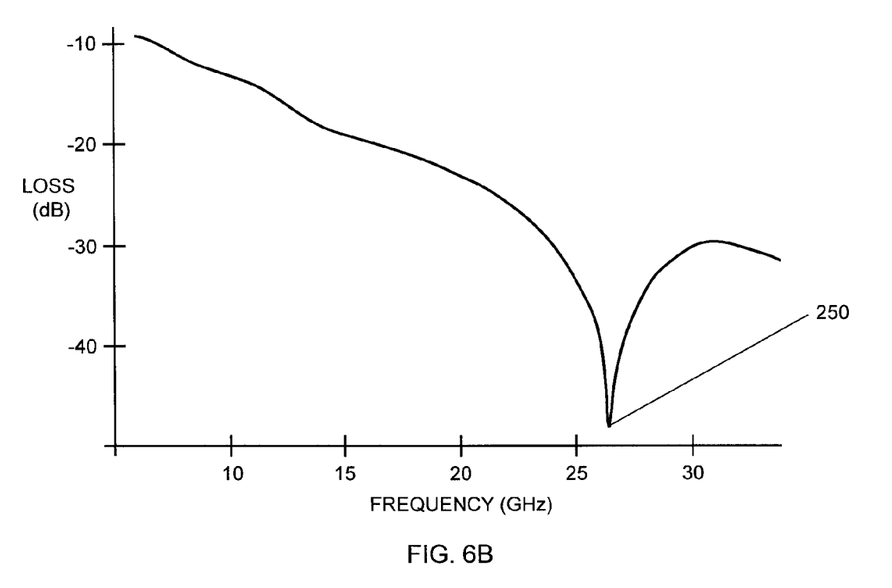
FIG. 6B is a graph showing the measured attenuation interconnect with a backdrill stub.
Figure 7A:
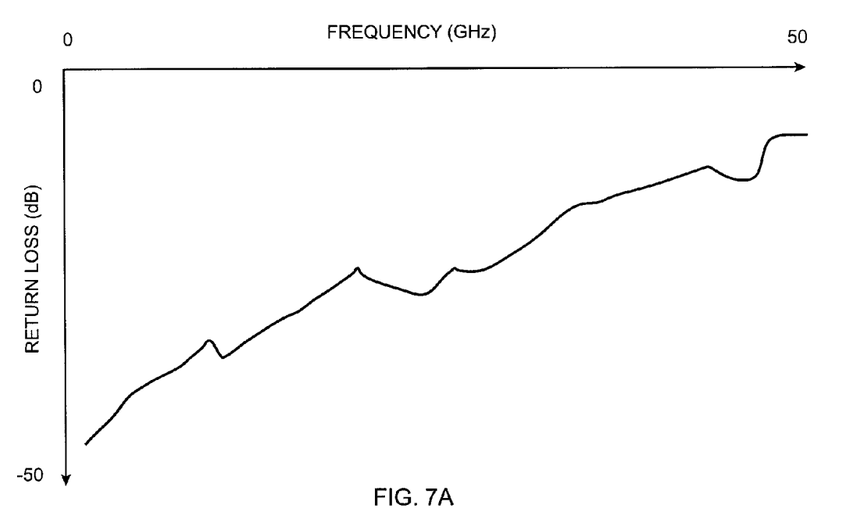
FIG. 7A is a graph showing the measured return loss on an interconnect with a proper backdrill.
Figure 7B:
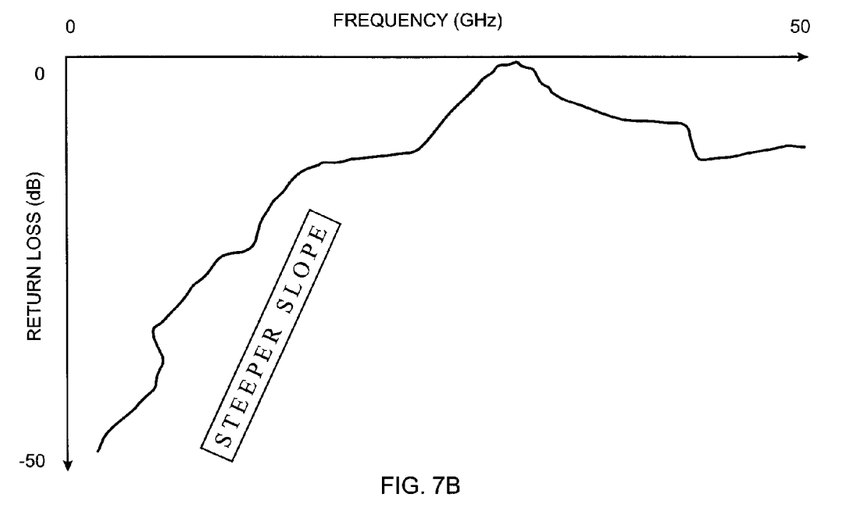
FIG. 7B is a graph showing the measure return loss on an interconnect with a stub not backdrilled.

When applying the above method to PCB striplines, the measured and calculated loss is that of the entire probed structure, this includes the transmission line, via structures, and surface pads. In structures required to support fast data transfer rates the via structures can significantly influence the loss profile, this becomes especially apparent in cases where the length of the via barrel extends beyond the layers it connects electrically. This via stub can be detected as a large dip 250, or resonance, in the insertion loss profile as is shown in the graphs of FIGS. 6A and 6B. FIG. 6A shows the measured attenuation interconnect with a proper backdrill and FIG. 6B shows the measured attenuation interconnect with a via stub. The Y axis represents loss in dB and the X axis represents frequency in GHz. The position and extent of the resonance depends on several factors including stub length, anti-pad size, and material properties. FIG. 7A is a graph that shows the measured return loss on an interconnect with a proper backdrill. The Y axis represents the return loss in dB and the X axis represents frequency in GHz. FIG. 7B is a similar graph showing the measured return loss on an interconnect with a stub not backdrilled.

Processing algorithms as part of an embodiment of the invention can use the measured and calculated insertion loss profile to identify a via stub resonance and find its associated resonance frequency. Given known anti-pad sizes and material properties, the resonance frequency can be used to calculate the via stub length using a theoretical formula. Additionally, the steep slope of the return loss versus frequency profile at frequencies below the resonant frequency indicates the presence of a stub.

The following steps make up a method of calculating via stub length from the insertion loss profile. Calculate a regression of the insertion loss ending at a frequency significantly below what is expected for via stub resonances, e.g. 10 GHz. Next, extrapolate regression to 50 or more GHz. Search insertion loss profile out to 50 or more GHz for data points that fall significantly below the regression. For example, data with a loss value of greater than 3 times the regression value can be identified as part of a resonance. Smooth and differentiate the resonance to find the minimum loss value and its corresponding frequency. Calculate via stub length using the resonance frequency and known anti-pad sizes and material properties from a theoretical formula.

A table of relationship of resonant frequency from insertion loss or return loss profile for material Dk=3.7 is shown in the table below:

| Measured Resonance Frequency (GHz) | Stub length (0.001 inch) |
| --- | --- |
| 11 | 100 |
| 14 | 90 |
| 16 | 80 |
| 20 | 70 |
| 23 | 60 |
| 25 | 50 |
| 27 | 40 |
| 30 | 30 |
| 34 | 20 |
| 37 | 10 |
| 39 | 0 |

Figure 8:
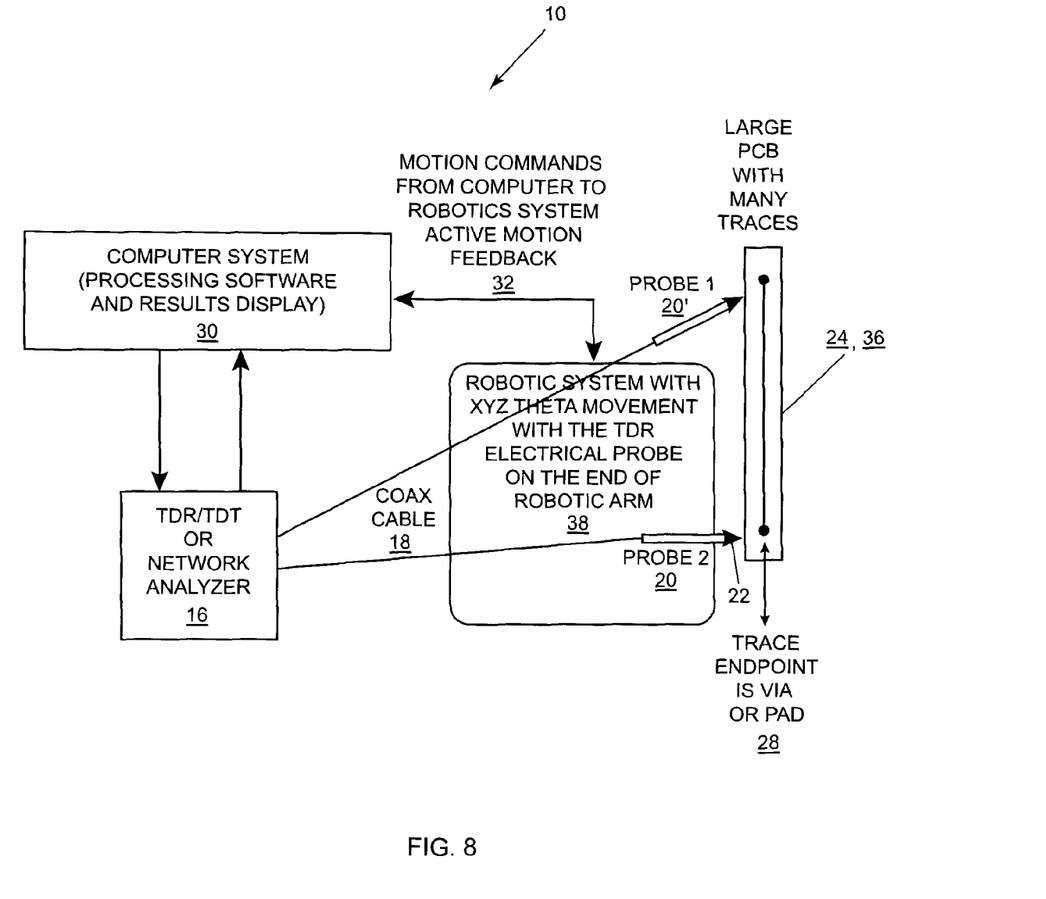
FIG. 8 shows a dual probe embodiment.

Via stub length may be measured using a robotic system equipped with either a network analyzer or TDT instrument used for measuring insertion loss and return loss. The via stub length is calculated from the resonance signature in the insertion and/or return loss profiles as shown in FIGS. 6B and 7B using the steps stated above. In an another embodiment, the robotic system may have multiple moving arms each containing one or more RF probes with a minimum of two arms containing one RF probe each, as shown in FIG. 8. The robotic system may be programmed to measure via stub length of one or more DUT's on a given test vehicle, for example all (100%) of the traces, both single-ended and differential on a PC board.

Industrial Example

An embodiment of the disclosed method and apparatus includes the following system, as shown in FIG. 1. The preferred system has a computer system 30, a TDR unit 16, a coax cable 18, a RF probe 20 and a device under test (DUT) 24 that can be a PCB with one or many interconnects.

Computer 30 preferably contains the following subsystems:

1. Ability of the user of the system to define a test recipe that defines the pass/fail criteria for stub length, name of the interconnect trace to be measured (as a guide during testing operations to the operator to place the RF probe on the trace).
2. Calibration routine to guide the operator through the process and to collect and save the calibration data (waveforms).
3. Processing software to calculate the losses from the collected TDR waveform data collected during testing operations.
4. Pass/fail assessment module to determine if the measurement passed or failed based on the preset test criteria.
5. Store, display and report module to display the results for the operator.
6. Communication module to setup the TDR unit and to query and collect the measurement data from the unit.

Coax Cable 18 is preferably utilized to connect TDR unit 16 to RF probe 20.

RF Probe 20 is preferably utilized as a means to transfer the test signals from TDR unit 16 into DUT 24. RF probe 20 can be a single-ended probe or a differential probe.

DUT 24 is a test coupon or PCB board.

As described in FIG. 3, the operator performs a calibration step 110 to calibrate the entire measurement system including the TDR unit, cable and probe. After calibration, test operations begin 100 as the operator selects the test recipe that will be run. The test recipe defines how many traces will be tested per PCB or test coupon and contains the criteria for testing. The operation enters a work order number and serial number. The operator then places the RF probe onto the first trace as per the instructions within the recipe. Using a foot pedal or enter key on the computer system keyboard, the operator then instructs the system to perform the measurement. The computer system software sets up the TDR unit and commands the TDR unit to generate the appropriate test signal through the coax cable and RF probe and into the DUT trace. The computer system then communicates with the TDR unit and collects the reflected waveform that the TDR unit collected in response to the injected test signal. The computer system processes the reflected waveform as per the disclosed method and calculates the insertion and return loss. The computer system then assesses the pass or fail and reports the data along with the stub length.

FIG. 2 shows a mechanized embodiment of the disclosed method and apparatus which includes a computer system 30, at least one TDR unit 16, at least one coax cable 18, at least one RF probe 20, a XYZTheta Robotic System 38 and at least one device under test (DUT) 24 which can be a PCB with one or many interconnects.

Computer 30 preferable contains the following subsystems:
1. Ability of the user of the system to define a test recipe that defines the pass/fail criteria for stub length, name of the interconnect trace to be measured and coordinate location of the endpoints of the traces (to guide the movement of the robotic system).
2. Calibration routine to guide the operator through the process and to collect and save the calibration data (waveforms).
3. Processing software to calculate the losses from the collected TDR waveform data collected during testing operations.
4. Pass/fail assessment module to determine if the measurement passed or failed based on the preset test criteria.
5. Store, Display and report module to display the results for the operator.
6. Communication module to setup the TDR unit and to query and collect the measurement data from the unit.
7. Communication module to command the robotic system to move to preset coordinates based on the system test recipe and do so at a specific time.

Coax Cable 18 is utilized to connect TDR unit 16 to RF probe 20.

RF Probe 20 is utilized as a means to transfer the test signals from TDR unit 16 into DUT 24. RF probe 20 can be a single-ended probe or a differential probe and is held by the robotic system end of arm.

DUT 24 is preferably a test coupon or PCB board.

As shown in FIG. 3, the operator performs a calibration step 110 to calibrate the entire measurement system including the TDR unit, cable and RF probe. After calibration, test operations 100 begin as the operator selects the test recipe that will be run. The test recipe defines how many traces will be tested per PCB or test coupon and contains the criteria for testing. The operation enters a work order number and serial number. The operator then initiates the measurement process by hitting a start button the user interface. The computer system then instructs the robotic system then moves the RF probe onto the first trace as per the coordinates within the recipe. The computer system software sets up the TDR unit and commands the TDR unit to generate the appropriate test signal through the coax cable and RF probe and into the DUT trace. The computer system then communicates with the TDR unit and collects the reflected waveform that the TDR unit collected in response to the injected test signal. The computer system processes the reflected waveform as per the disclosed method and calculates the insertion and return loss. The computer system then assesses the pass or fail and reports the data along with the stub length. The process is then automatically repeated for each traces on the PCB with the computer continuing guiding the robotic system to move the RF probe and instructing the TDR unit through each trace to measure. Once all traces are measured as per the test recipe, then the system stops. The operator can generate a written report of the results or continue to test the next serial number.

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical or physical partitioning and configurations can be implemented to implement the desired features of the disclosed method and apparatus. In addition, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements, or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although the embodiments of the invention have been described in detail with particular reference to these preferred embodiments, other embodiments can achieve the same results. It is anticipated that the software that utilizes the method will continue to change the appearance of its user interface and evolve. Variations and modifications of the present invention will be obvious to those skilled in the art and it is intended to cover in the appended claims all such modifications and equivalents. The entire disclosures of all references, applications, patents, and publications cited above, are hereby incorporated by reference.

What is claimed is:

1. A method for determining return loss of a device under test (DUT), the method comprising the steps of:
   inserting a step waveform through a Radio Frequency (RF) probe, when the probe is not in contact with the DUT to obtain a calibrated reflected step waveform; saving the calibrated reflected step waveform
   inserting the step waveform through the RF probe, when the probe is in contact with the DUT to obtain a measured reflected step waveform; saving the measured reflected step waveform;
   windowing into time segments the calibrated reflected step waveform and the measured reflected step waveform; and
   calculating a the return loss from the windowed waveforms.

2. The method of claim 1 further comprising the step of narrowing the windowed waveforms.

3. The method of claim 1 wherein the step of calculating further comprises locating a length of at least one resonance stub.

4. The method of claim 1 comprising determining the return loss via a robotic tester.

5. The method of claim 1 wherein the step of inserting the step waveform into the probe, when the probe is not in contact with the DUT, for obtaining the calibrated reflected step waveform comprises an open RF probe.

6. The method of claim 1 wherein the step of inserting the step waveform into the probe, when the probe is not in contact with the DUT, for obtaining the calibrated reflected step waveform comprises a shorted RF probe.

7. A method for determining insertion loss of a device under test (DUT), the method comprising the steps of:
   inserting a step waveform through a Radio Frequency (RF) probe, when the probe is not in contact with the DUT to obtain a calibrated reflected step waveform; saving the calibrated reflected step waveform
   inserting the step waveform through the RF probe, when the probe is in contact with the DUT to obtain a measured reflected step waveform; saving the measured reflected step waveform;
   windowing the calibrated reflected step waveform and the measured reflected step waveform; and
   calculating the insertion loss from the windowed waveforms.

8. The method of claim 7 further comprising the step of narrowing the windowed waveforms.

9. The method of claim 7 wherein the step of calculating further comprises locating a length of at least one resonance stub.

10. The method of claim 7 comprising determining the insertion loss via a robotic tester.

11. The method of claim 7 wherein the step of inserting the step waveform into the probe, when the probe is not in contact with the DUT, for obtaining the calibrated reflected step waveform comprises an open (RF) probe.

12. The method of claim 7 wherein the step of inserting the step waveform into the probe, when the probe is not in contact with the DUT, for obtaining the calibrated reflected step waveform comprises a shorted RF probe.

13. A system for determining return loss of a device under test (DUT) comprising;
   means for inserting a step waveform through a Radio Frequency (RF) probe, when the probe is not in contact with the DUT to obtain a calibrated reflected step waveform;
   means for saving the calibrated reflected step waveform;
   means for inserting the step waveform through the RF probe, when the probe is in contact with the DUT to obtain a measured reflected step waveform;
   means for saving the measured reflected step waveform;
   means for windowing into time segments the calibrated reflected step waveform and the measured reflected step waveform; and
   means for calculating the return loss from the windowed waveforms.

14. The system of claim 13 comprising a robotic tester for determining the return loss of the DUT.

15. A system for determining insertion loss of a device under test (DUT) comprising:
   means for inserting a step waveform through a Radio Frequency (RF) probe, when the probe is not in contact with the DUT to obtain a calibrated reflected step waveform;
   means for saving the calibrated reflected step waveform;
   means for inserting the step waveform through the RF probe, when the probe is in contact with the DUT to obtain a measured reflected step waveform;
   means for saving the measured reflected step waveform;
   means for windowing the calibrated reflected step waveform and the measured reflected step waveform; and
   means for calculating the insertion loss from the windowed waveforms.

16. The system of claim 15 comprising a robotic tester for determining the insertion loss of the DUT.

17. A non-transitory computer-executable storage medium comprising program instructions which are computer-executable to implement a determination of return loss of a device under test (DUT) comprising:
   program instructions that cause a step waveform to be inserted through a Radio Frequency (RF) probe, when the probe is not in contact with the DUT to obtain a calibrated reflected step waveform;
   program instructions that cause the calibrated reflected step waveform to be saved;
   program instructions that cause a step waveform to be inserted through the RF probe, when the probe is in contact with the DUT to obtain a measured reflected step waveform;
   program instructions that cause the measured reflected step waveform to be saved;
   program instructions that cause the calibrated reflected step waveform and the measured reflected step waveform to be windowed into time segments; and
   program instructions that cause the return loss be calculated from the windowed waveforms.

18. The non-transitory computer-executable storage medium of claim 17 further comprising program instructions that cause the windowed waveforms to be narrowed.

19. The non-transitory computer-executable storage medium of claim 17 further comprising program instructions that cause a length of at least one resonance stub be located from the windowed waveforms.

20. The non-transitory computer-executable storage medium of claim 17 comprising determining the return loss via a robotic tester.

21. A non-transitory computer-executable storage medium comprising program instructions which are computer-executable to implement a determination of insertion loss of a device under test (DUT) comprising:
   program instructions that cause a step waveform to be inserted through a Radio Frequency (RF) probe, when the probe is not in contact with the DUT to obtain a calibrated reflected step waveform;
   program instructions that cause the calibrated reflected step waveform to be saved;
   program instructions that cause the step waveform to be inserted through the RF probe, when the probe is in contact with the DUT to obtain a measured reflected step waveform;
   program instructions that cause the measured reflected step waveform to be saved;
   program instructions that cause the calibrated reflected step waveform and the measured reflected step waveform to be windowed; and
   program instructions that cause the insertion loss be calculated from the windowed waveforms.

22. The non-transitory computer-executable storage medium of claim 21 further comprising program instructions that cause the windowed waveforms to be narrowed.

23. The non-transitory computer-executable storage medium of claim 21 further comprising program instructions that cause a length of at least one resonance stub be located from the windowed waveforms.

24. The non-transitory computer-executable storage medium of claim 21 comprising determining the insertion loss via a robotic tester.

* * * * *